United States Patent [19]
Arthur et al.

[11] Patent Number: 5,672,214
[45] Date of Patent: *Sep. 30, 1997

[54] CONCRETE SOLAR CELL

[75] Inventors: John R. Arthur, Corvallis; Robert K. Graupner, Portland; Tyrus K. Monson, Corvallis; James A. Van Vechten, Corvallis; Ernest G. Wolff, Corvallis, all of Oreg.

[73] Assignee: State of Oregon, acting by and through the State Board of Higher Education on behalf of Oregon State University, Corvallis, Oreg.

[*] Notice: The term of this patent shall not extend beyond the expiration date of Pat. No. 5,415,700.

[21] Appl. No.: 441,451

[22] Filed: May 15, 1995

Related U.S. Application Data

[63] Continuation-in-part of Ser. No. 166,307, Dec. 10, 1993, Pat. No. 5,415,700.
[51] Int. Cl.$^6$ .................... H01L 31/0384; H01L 31/04
[52] U.S. Cl. .................... 136/250; 136/251; 136/256; 136/259; 437/2; 437/218; 437/219
[58] Field of Search .................... 136/250–251, 136/256, 259; 437/2, 4, 218–219

[56] References Cited

U.S. PATENT DOCUMENTS

| | | | |
|---|---|---|---|
| 4,021,323 | 5/1977 | Kilby et al. | 136/246 |
| 4,116,207 | 9/1978 | Dominguez | 136/251 |
| 4,353,746 | 10/1982 | Birchall et al. | 106/89 |
| 4,353,747 | 10/1982 | Birchall et al. | 106/89 |
| 4,353,748 | 10/1982 | Birchall et al. | 106/89 |

(List continued on next page.)

FOREIGN PATENT DOCUMENTS

| | | |
|---|---|---|
| 0021682 | 1/1981 | European Pat. Off. . |
| 0055035 | 6/1982 | European Pat. Off. . |

OTHER PUBLICATIONS

J.P. Wightman, T.A. De Vilblis, and J.G. Dillard, "Carbon Fibers: Properties, Testing and Analysis" in *International Encyclopedia of Composites*, vol. 1, Acetal Resins and Composites... Cyanate Ester, edited by S.M. Lee, 1989, pp. 226–241.

S. Lin, "Application of Short Carbon Fibers in Construction" *Sampe Journal* vol. 30, No. 5, pp. 39–45, 1994.

J.D. Birchall, et al., "Flexural strength and porosity of cements," Macmillan Journals Ltd., Nature vol. 289, Jan. 1981, pp. 050388–050390.

J.D. Levine, et al., "Basic Properties of the Spherical Solar™ Cell," IEEE, CH2953, Aug. 1991, pp. 1045–1048.

*Primary Examiner*—Aaron Weisstuch
*Attorney, Agent, or Firm*—Stoel Rives LLP

[57] ABSTRACT

An inexpensive, robust concrete solar cell (10) comprises a photovoltaic material embedded in and extending beyond front and rear major surfaces (18 and 16) of a matrix layer (14). The matrix layer typically comprises a high-strength, cementitious material, such as a macrodefect-free cement, reinforced with electrically nonconductive fibers (54) distributed throughout the matrix layer. The photovoltaic material comprises particles (12) of high-resistivity single crystal silicon, typically ball milled from ingot sections unsuitable for slicing into silicon wafers. An aluminum sheet (28) attached to the rear major surface provides electrical contact to one of two electrical region (22 and 24) of the semiconductor particle, and a translucent conductive layer (30) on the front major surface provides electrical contacts to the second electrical region. Overlapping electrically conductive reinforcing fibers (52) are embedded at the front major surface of the matrix layer to decrease the sheet resistivity of the surface and to inhibit the formation of surface cracks. Digitated electrode (32) further improves surface conductivity for conducting current off the cell. A voltage is generated between the two conductive layers when light incident on the semiconductor particles through the translucent conductive layer creates charge carriers that are propelled toward the conductive layers by a built-in field.

28 Claims, 4 Drawing Sheets

U.S. PATENT DOCUMENTS

| | | | |
|---|---|---|---|
| 4,363,667 | 12/1982 | Birchall et al. | 106/90 |
| 4,410,366 | 10/1983 | Birchall et al. | 106/90 |
| 4,521,640 | 6/1985 | Levine | 136/250 |
| 4,614,835 | 9/1986 | Carson et al. | 136/250 |
| 4,691,076 | 9/1987 | Levine et al. | 136/250 |
| 4,806,495 | 2/1989 | Levine et al. | 437/2 |
| 4,872,607 | 10/1989 | Jensen et al. | 228/180.1 |
| 4,917,752 | 4/1990 | Jensen et al. | 156/292 |
| 5,192,400 | 3/1993 | Parker et al. | 205/124 |
| 5,415,700 | 5/1995 | Arthur et al. | 136/250 |

CONCRETE SOLAR CELL

This application is a continuation-in-part of U.S. patent application Ser. No. 08/166,307, filed Dec. 10, 1993 and issued as U.S. Pat. No. 5,415,700.

TECHNICAL FIELD

This invention relates to an economical, robust solar cell.

BACKGROUND OF THE INVENTION

Solar cells convert light into useful energy, such as electricity or chemical energy. The high cost of solar cells, however, has prevented them from competing with conventional devices for generating power. Solar cells have typically been limited to low power applications, such as calculators, or niche applications, such as powering spacecraft, buoys, or other remote equipment.

Solar cells are typically constructed by forming a pn junction on a wafer of single-crystal, electronic-grade semiconductor silicon. The pn junction is typically formed parallel to the major surfaces of the silicon wafer. One side of the pn junction is electrically contacted by a conductor on the back surface of the solar cell, while the other side of the pn junction is contacted by a metallic grid on the front surface of the solar cell. Light incident on the cell creates electron-hole pairs that cause a voltage difference between the conductor on the back surface of the cell and the conductive grid on the front surface of the cell. Because such cells require electronic-grade semiconductor silicon, they are expensive to manufacture. Such cells are relatively fragile and typically require mounting in a protective enclosure having a cover of a translucent material, i.e., a material that transmits a portion of the incident light.

Another type of solar cell that is constructed from spheres of metallurgical-grade silicon is described in Levine et al., "Basic Properties of the Spheral Solar™ Cell," *Proceedings of the Twenty Second IEEE Photovoltaic Conference*, Vol. 2, pp. 1045–48 (1991). Spheres of metallurgical-grade silicon somewhat smaller than 1.0 mm in diameter and including a p-type dopant are purified, and an outer shell of each sphere is doped with an n-type material to form a pn junction. The spheres are bonded to a flexible aluminum foil in an array of holes such that a portion of each sphere extends out of both sides of the foil. Electrical contacts are formed between the aluminum and the outer n-type shell. A sheet of insulating material, e.g., plastic, is applied to the back surface of the foil and abraded so that a portion of each sphere is exposed. The spheres are etched to allow formation of an electrical contact to the inner p-type material. Although such cells are purportedly cheaper to produce than cells using wafers of electronic-grade semiconductor silicon, the manufacture of such cells is complex. Furthermore, such cells, like previous cells, are relatively fragile and must be mounted in a protective module having a translucent glass or polymer superstrate if they are to be used in a terrestrial environment.

Another type of solar cell uses silicon crystals of both n- and p-types embedded in a frit glass insulator, surrounded by clear hydrobromic acid on one side and metal on the other. The voltage between the two types of silicon crystals causes an electrochemical reaction that produces gaseous hydrogen, liquid bromine, and heat. The solar energy is thus stored as chemical energy in the hydrogen and bromine, which can be used in a fuel cell. McKee et al., "Development and Evaluation of the Texas Instruments Solar Energy System," *16th IEEE PVSC Proceedings*, p. 257 (1982).

SUMMARY OF THE INVENTION

An object of the present invention is, therefore, to convert light inexpensively into a useful energy source.

Another object of this invention is to produce an economical, large-surface-area solar cell for converting solar radiation into electricity.

A further object of this invention is to produce such a solar cell that is sufficiently robust to function with little or no maintenance for extended periods in outdoor environments.

Yet another object of this invention is to reduce the cost of disposing of scrap silicon produced during the manufacturing of silicon wafers.

Still another object of the invention is to produce a reinforced solar cell having improved mechanical strength.

Yet another object of this invention is to produce such a cell having improved surface electrical conductivity.

Still another object of this invention is to produce such a cell using an inexpensively produced junction.

Yet another object of this invention is to produce an environmentally robust and benign solar cell.

Still another object of this invention is to produce such a cell that is inexpensive to deploy.

The present invention comprises an apparatus for converting light into useable energy and a method for manufacturing the apparatus. Particles of a photovoltaic material are embedded in and extend beyond the major surfaces of a dielectric matrix, such as a high-strength cementitious material. Applicants refer to the photovoltaic combination of semiconducting particles with a cementitious matrix bonded by electrically conductive planes as a "concrete solar cell." Light incident on the semiconductor particles generates charge carriers. A "built-in" electric field that results from differences in electronic properties either within the semiconductor particles or between the semiconductor particles and an adjacent material causes the charge carriers to travel to the portions of the semiconductor particles extending beyond the dielectric matrix layer, where a useful voltage is produced.

In a preferred embodiment, the semiconductor particles comprise single-crystal silicon. The silicon particles can be provided, for example, by comminuting by-products of silicon wafer production, such as ingot ends that are unsuitable for wafer production. The dielectric matrix material is typically a rigid, weather-resistant material, such as a high-strength cement, with a macrodefect-free cement ("MDFC") being the preferred material.

An aluminum sheet is positioned on one side of the dielectric matrix layer and contacts the silicon particles that extend beyond the layer to carry current produced by the semiconductor particles. If the semiconductor particles comprise high-resistivity n-type silicon particles, the built-in electric field can be produced by a pn junction formed by melting the aluminum and silicon together at the silicon-aluminum interface. The interface is solidified using the 578° C. eutectic reaction, leaving a portion of the silicon doped with aluminum atoms to create a p-type region in each n-type particle and thereby simultaneously forming a pn junction and an electrical contact between the aluminum sheet and the p-type region. The 578° C. eutectic reaction can also be used to create pn junctions in high-resistivity p-type scrap silicon by first converting the p-type silicon to n-type silicon by, for example, annealing the silicon to electrically activate dissolved oxygen.

The front side of the dielectric matrix layer, from which the n-type portion of the silicon particles protrude, is covered with a translucent conductive layer, such as indium tin oxide ("ITO") or zinc oxide doped with either aluminum ("ZnO:Al") or gallium ("ZnO:Ga"), that provides electrical contacts to the n-type portion. In other embodiments, the solar cell can use built-in fields present at an interface between the silicon and adjacent conductors, such as the front side transparent conductive layer, the backside conductive layer, or a conductive layer coated onto the silicon particles.

The dielectric matrix can be strengthened by using reinforcing fibers in contact with and reinforcing the dielectric material. In one preferred embodiment, electrically nonconductive fibers, such as chopped Kevlar™ fibers, are randomly distributed within the MDFC to provide three-dimensional reinforcement. In another preferred embodiment, overlapping reinforcing fibers in the form of a cloth extend in two transverse directions within a plane. Such reinforcing fibers positioned at one or both of the major surfaces of the dielectric layer inhibit the formation of surface cracks. If reinforcing fibers positioned at a major surface are composed of an electrically conductive material, they decrease the sheet resistivity of the concrete solar cell surface. Preferred fibers comprise a graphitic, i.e., graphite or graphite-like, material, optionally coated with a metal to reduce contact resistance between the reinforcing fibers and the translucent conductive layer. Non-conductive fibers positioned at a major surface would adversely affect the surface conductivity.

In yet another preferred embodiment, relatively short electrically nonconductive chopped Kevlar™ fibers are mixed in the dielectric matrix layer to provide three-dimensional reinforcement and electrically conductive, metal-coated graphitic fibers are positioned at the front surface of the solar cell to provide two-dimensional reinforcement, prevent cracks in the transparent conductive layer, and reduce the sheet resistance of the front surface.

A digitated, metallic grid is optionally added to reduce the sheet resistance of the front surface. A protective layer, such as a translucent MDFC layer or a non-conductive ZnO layer, may be added over the conductive ITO or ZnO layer and metallic grid.

Large-area, robust photovoltaic panels can be constructed, for example, as shingles, building modules, or as the top surfaces of concrete railroad ties. The invention can also be used as part of an electrochemical cell.

Additional objects and advantages of the present invention will be apparent from the following detailed description of preferred embodiments thereof, which proceeds with reference to the accompanying drawings.

DETAILED DESCRIPTION OF PREFERRED EMBODIMENTS

FIGS. 1–4 show a first preferred embodiment of a photovoltaic cell 10 of the present invention. Photovoltaic cell 10 comprises semiconductor particles 12 embedded in a dielectric matrix layer 14 having first and second major surfaces 16 and 18. Semiconductor particles 12 and matrix layer 14 together form a concrete layer 20.

Each semiconductor particle 12 includes a portion 22 of a p-type material and a portion 24 of an n-type material that together form a pn junction 26 at their interface and extend beyond major surfaces 16 and 18, respectively, to electrically contact a conductive layer 28 and a translucent conductive layer 30, respectively. A digitated electrode 32 positioned on translucent conductive layer 30 reduces the effective electrical sheet resistance of translucent conductive layer 30. Semiconductor particles 12 and the various layers shown in the figures are exaggerated for clarity.

Figure 4:
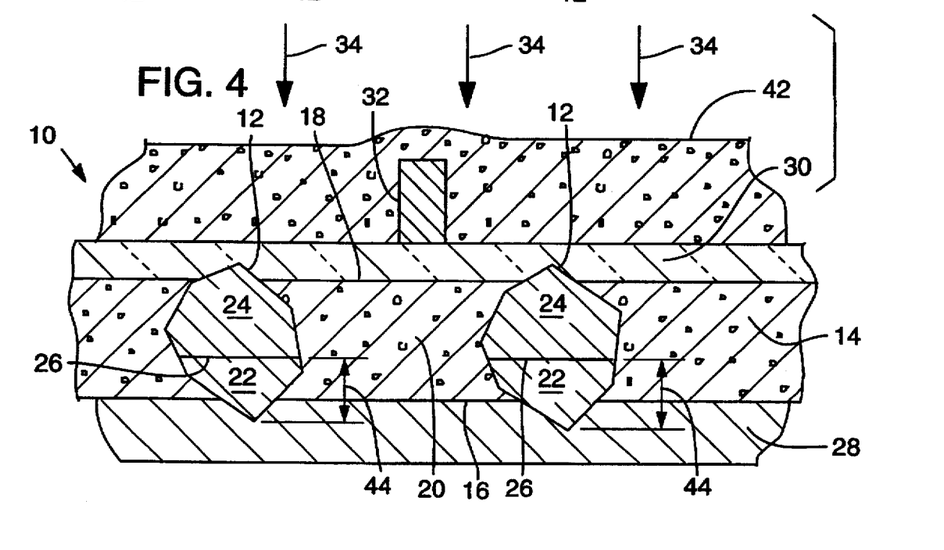
FIG. 4 is an enlarged, fragmentary view of the area labelled "4" of FIG. 2.

Light 34 incident on semiconductor particle 12 and having energy greater than the band gap energy of the photovoltaic material comprising particle 12 passes through translucent conductive layer 30 and creates in semiconductor particle 12 charge carriers, i.e., a conduction band electron and a valence band hole. An electric field, known in the art as a "built-in field," within the pn junction causes the electrons to move toward translucent conductive layer 30 and causes the holes to move toward conductive layer 28, thereby producing a voltage between conductive layers 28 and 30 that can be used to do work such as driving an electrical load or an electrochemical cell.

Figure 2:
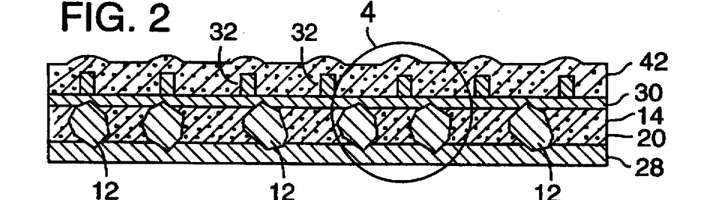
FIGS. 2 and 3 are sectional views taken along respective lines 2—2 and 3—3 of FIG. 1.
Figure 3:
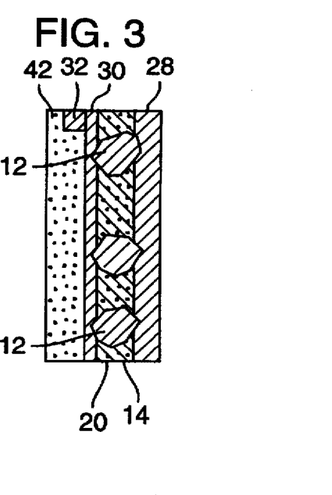

Although any high strength cement can be used to form matrix layer 14, it is preferably composed of an MDFC having a flexural strength greater than 10 MPa. An MDFC is exceptionally strong because, unlike ordinary cement, it contains essentially no large voids. For example, an MDFC may contain less than 2 percent voids by volume, with essentially no voids larger than 10 µm. Such large voids considerably weaken ordinary cement. The flexural strength of an MDFC is, therefore, typically two orders of magnitude greater than that of normal cement, and its fracture energy is typically five orders of magnitude greater than that of ordinary cement. An MDFC can be formed from many cementitious materials by carefully controlling the grain size, using a high-shear mixer that deflocculates the grains, lubricating the particles with a water-soluble organic polymer, and casting or calendering the cement at moderate pressures of between approximately 5 MPa and 50 MPa. The proportion of water in the MDFC composition is typically less than 25 percent, and preferably less than 12 percent by weight, although the amount of water should not be so low that a plastic dough-like shapeable cementitious composition cannot be formed.

A preferred MDFC, as described in Popoola et al., "Microstructural and Microchemical Characterization of a Calcium Aluminate-Polymer Composite (MDF Cement)," 74 J. Am. Ceramic Soc., pp. 1928-33 (1991), includes calcium aluminate cement, poly(vinyl alcohol/acetate), glycerine plasticizer, and distilled water. The poly(vinyl alcohol/acetate) may be 79.3 mol% hydrolyzed with a 1,700-unit degree of polymerization and a medium particle size of 12 µm.

When the cement matrix is to be heated above 450° C., as when the Si—Al eutectic reaction is to be employed, the strength of the final matrix may be increased by adding boric oxide ($B_2O_3$) to the mixture. This is conveniently done by saturating the water with $B_2O_3$ before adding it to the cement powder.

FIGS. 5–8 show a second preferred embodiment of a photovoltaic cell 50 of the present invention. Photovoltaic cell 50 includes plural fibers 52 and 54 in contact with and reinforcing a concrete layer 64 comprising MDFC with embedded semiconductor particles 12. Electrically conductive reinforcing fibers 52 are positioned at a first major surface 66 of concrete layer 64 to provide mechanical strength and enhance electrical conductivity. Electrically nonconductive reinforcing fibers 54 are distributed within the concrete layer 64. Conductive or nonconductive reinforcing fibers (not shown) can also be attached to a second major surface 68 of dielectric matrix layer 64 in addition to or instead of those attached to surface 66.

Figure 6:
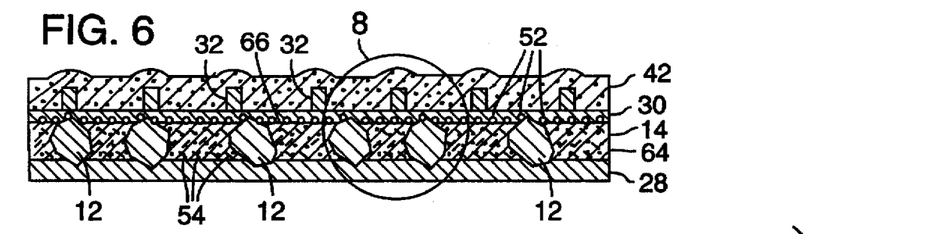
FIGS. 6 and 7 are sectional views taken along respective lines 6—6 and 7—7 of FIG. 5.
Figure 7:
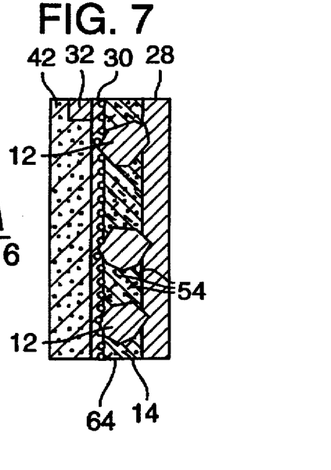
Figure 8:
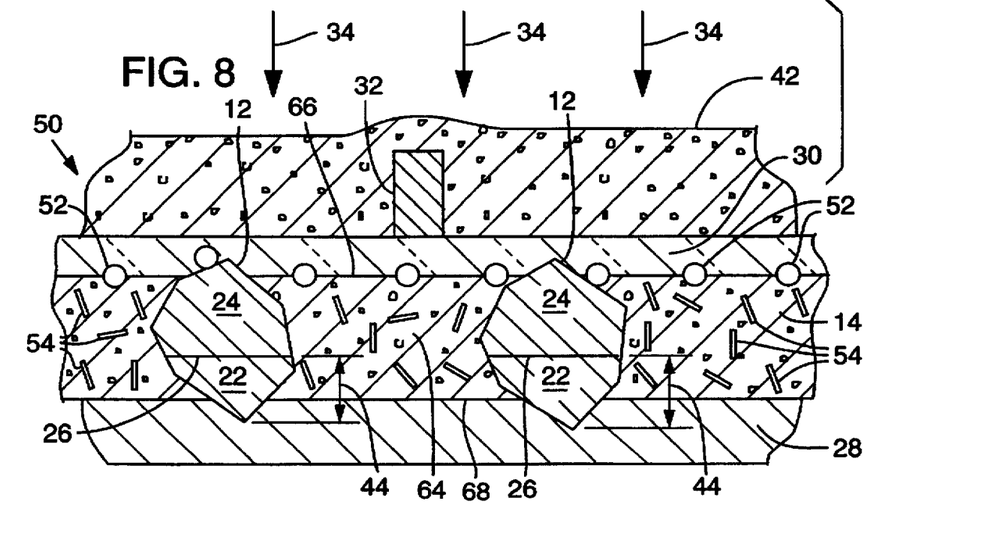
FIG. 8 is an enlarged, fragmentary view of the area labelled "8" of FIG. 6.

Reinforcing fibers 52 and 54 are typically embedded in cement layer 64. Preferred fibers 52 and 54 have high tensile strength and bond well to the cementitious material of matrix layer 14. In one preferred embodiment, reinforcing fibers 54 comprise electrically insulating fibers that are relatively short compared to the thickness of matrix layer 64. Such fibers are added to the cement before or during mixing so that they end up being randomly distributed through cement layer 64. For example, reinforcing fibers 54 typically comprise chopped Kevlar™ or other aramid fibers having diameters of between about 10 μm and about 30 μm and lengths of between about 5 mm and about 10 cm. Preferred fibers 54 have a length of about 1 mm and a typical diameter of about 12 μm. The exact size of fibers 54 is not considered to be critical.

Reinforcing fibers 52 extend primarily within a plane parallel to, and are typically positioned at one or both, major surfaces 66 and 68. In one preferred embodiment, reinforcing fibers 52 comprise a cloth of overlapping graphite fibers that are embedded in concrete layer 64 at major surface 66.

Figure 1:
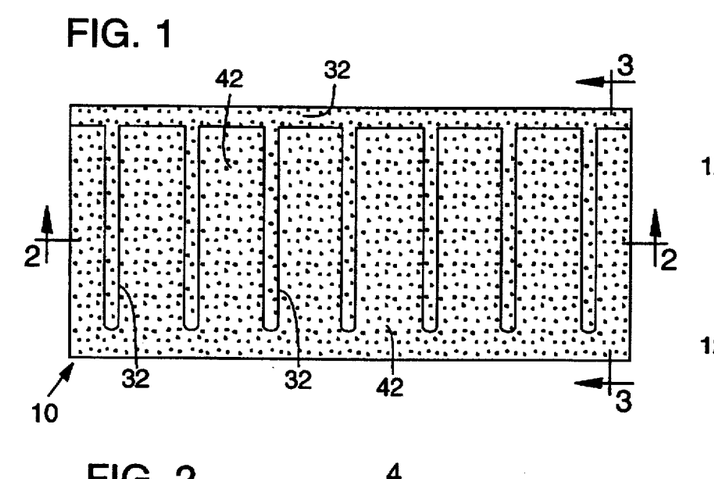
FIG. 1 is a plan view of a first embodiment of a solar cell of the present invention.
Figure 5:
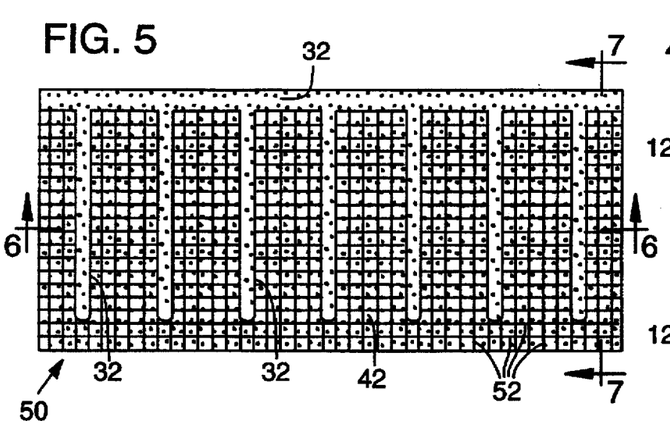
FIG. 5 is a plan view of an embodiment of a solar cell of the present invention that uses reinforcing fibers.

In manufacturing photovoltaic cells 10 and 50, semiconductor particles 12 may be added to the cement dough before calendering. The cement dough is typically calendered into a layer between 50 μm and 100 μm in thickness, the exact thickness depending upon the average dimensions of the semiconductor particles 12. Thicker layers, such as layers of 400 μm in thickness, are sturdier and easier to produce but make less efficient use of the available material.

Adding semiconductor particles 12 to the cement before it is processed in the high-shear mixer that defloculates the cement grains produces a cement having good mechanical strength but may damage the semiconductor particles 12. Adding semiconductor particles 12 to the cement in a low-force mixer after it has been defloculated is less likely to damage semiconductor particles 12 but may introduce voids, which produces a weaker cement and adversely affects the setting time. Alternatively, semiconductor particles 12 can be distributed onto conductive layer 28 and then an uncured MDFC matrix layer 14 can be calendered onto semiconductor particles 12 and conductive layer 28.

Calendering is performed preferably using hard rubber rollers that compress the cement paste and leave the ends of semiconductor particles 12 extending slightly beyond the cement paste. Calendering may also be performed using pliable sheets of plastic or rubber. The calendering scrubs the top surface of semiconductor particles 12 free of both oxide and cement and drives semiconductor particles 12 into conducting layer 28 with sufficient force to break the insulating oxide layers on the semiconductor particles 12 and conductive layer 28, which may comprise, for example, an aluminum foil. In some cases, however, it may be desirable to improve the electrical connection between particles 12 and conductive layer 28 by performing an additional cleaning step, such as grinding or polishing, to remove an insulating layer of cement from the ends of semiconductor particles 12.

An efficient photovoltaic cell 10 has a large proportion of the volume of concrete layer 20 composed of semiconductor particles 12. Too large a volume proportion of semiconductor particles 12 would, however, reduce the mechanical strength of photovoltaic cell 10 and increase the probability of undesirable electrical contacts between different semiconductor particles 12. A surface area of 35 percent semiconductor particles 12 has been attained in a photovoltaic cell 10 of sufficient strength to be practical. Silicon-to-cement volume ratios of 50 percent have also been attained while maintaining a practical level of strength.

The characteristics of the MDFC make it very suitable for use in photovoltaic cell 10. The MDFC is translucent and electrically insulating and can be cast into sheets as thin as 20 μm. It bonds with silicon semiconductor particles, Kevlar™ and graphite reinforcing fibers, and aluminum conductive layers. It is tough, strong, essentially nonporous, and water resistant and can withstand a wide range of temperatures. The relative dielectric constant of the MDFC is typically less than that of silicon. This difference in dielectric constants, and the corresponding difference in indices of refraction, results in light being refracted from the MDFC into the silicon and light from within the silicon being refracted back into the silicon. The MDFC thus acts as an antireflection coating to enhance the efficiency of photovoltaic cell 10. While silicon has a relative dielectric constant of 11.8, a calcium aluminum-based MDFC typically has a relative dielectric constant of between 7 and 9. The typical dielectric constant of ordinary Portland cement is even lower.

To allow the light to penetrate matrix layer 14 to reach semiconductor particles 12, matrix layer 14 should exhibit high transmissivity of sunlight. Ordinary Portland cement, while inexpensive, typically includes up to 6 percent iron oxides, which absorb sunlight and reduce the transmissivity of the cement. Other additives mixed into ordinary Portland cement to enhance its physical properties can also reduce transmissivity. Type II white Portland cement is essentially free of iron oxides and is, therefore, preferred over ordinary Portland cement, although it is more expensive. High-alumina cements, i.e., those that include higher concentrations of calciated alumina, also typically contain less iron oxides than ordinary Portland cement, but are significantly more expensive and have higher dielectric constants than Portland cements. Low iron oxide Pozzolanic-type and refractory cements may also be used.

Transmissivity can also be improved by improving grain bonding, for example, by maintaining the cement under pressure for a period of time, such as 24 hours, during casting or by curing the cement in a high-humidity environment, such as by maintaining the cement at 80° C. for 18 hours in a high-humidity environment.

In an embodiment that uses the 578° C. aluminum eutectic reaction to form pn junctions, semiconductor particles 12 preferably comprise high-resistivity (greater than 25 mohm-cm) n-type semiconductors when they are embedded into matrix layer 14. The particles can be made from high-resistivity semiconductor silicon doped with n-type electron donor impurities, such as phosphorus, arsenic, or antimony.

The particles can also be made from semiconductor silicon that is undoped or doped with p-type, electron acceptor impurities by electrically activating dissolved oxygen in the silicon to change the silicon to n-type. The oxygen is electrically activated by annealing, typically between 425° C. and 475° C., to move oxygen atoms from interstitial positions to lattice sites where they can donate valence band electrons. In a typical Czochralski-grown silicon crystal, annealing can activate approximately $3 \times 10^{16}$ atoms per $cm^3$ of oxygen, which is a sufficient concentration to change high-resistivity p-type silicon into high° resistivity n-type silicon.

In an embodiment using ZnO:Ga on a silicon surface to form a surface barrier junction, p-type silicon is preferred because it produces a higher open circuit voltage than does n-type silicon.

Semiconductor particles 12 can be formed by comminuting scrap sections of ingots grown for the production of silicon wafers to be used in the manufacture of integrated circuits and scrap silicon remaining in the growing crucible after an ingot is grown. Ingot sections such as the seed and tail ends that are unsuitable for slicing into wafers are suitable for use in photovoltaic cell 10 of the present invention. Semiconductor particles 12 are preferably milled to an octahedral shape having an average particle size of 50 µm to 100 µm using a ball mill and sieves. An average grain size of 50 µm would produce a more efficient photovoltaic cell 10, but such a cell would be more difficult to produce than a photovoltaic cell 10 having a larger grain size. The use of ball mills and sieves for producing particles of uniform size is well known in the powder metallurgy art. Approximately 65 percent of the silicon produced in the United States is of a high-resistivity type suitable for such use. The present invention thus provides a beneficial use for scrap material that is a currently a costly waste disposal problem for the silicon industry.

Milling semiconductor particles 12 from larger crystals of semiconductor silicon can cause crystal defects in semiconductor particles 12. Such defects cause high surface recombination velocities and low minority carrier lifetimes that reduce the efficiency of photovoltaic cell 10.

The amount of crystal structure damage can be reduced by adding a lubricant during the milling process to reduce the energy of comminution. Suitable lubricants include those typically used in the slicing operation of silicon wafer manufacturing. Other methods also believed to be useable for reducing the crystal structure damage include annealing the semiconductor particles 12 prior to casting them into matrix layer 14 and etching semiconductor particles 12 to enhance stable crystal facets and passivate dislocations.

Another technique that may be useful for improving minority carrier lifetimes and surface recombination velocity includes growing an oxide layer on semiconductor particles 12 and then heating them to approximately 1,000° C. in the presence of lime to convert a portion of the oxide to calciated silica, thereby passivating dislocations. This method may also enhance the mechanical properties of cell 10 by increasing the adhesive between photovoltaic cell 10 and the MDFC material. The surface recombination velocity and minority carrier lifetime may also be improved by forming an n-type layer on semiconductor particles 12 using chemical vapor deposition organo-metallic chemical vapor deposition. The surface of the semiconductor particles 12 may also be passivated by reacting with the cement, with the degree of passivation being determined by the type of cement used.

Semiconductor particles 12 can also be formed from electronic-grade polycrystalline silicon or from metallurgical grade silicon as described by Jules D. Levine et al., in "Basic Properties of the Spheral Solar™ Cell," *Proceedings of the Twenty Second IEEE Photovoltaic Conference*, Vol. 2, pp. 1045–48 (1991), and U.S. Pat. No. 5,069,740 for "Production of Semiconductor Grade Silicon Spheres from Metallurgical Grade Silicon Particles." Levine et al. used spheres having diameters on the order of 1 mm. Such large spheres would require a correspondingly thick matrix layer 14. Skilled persons will recognize, however, that the process described by described by Levine et al. can also be used to produce smaller spheres more suitable for use in the present invention.

Shards of silicon from polysilicon production can also be used to form semiconductor particles. Such shards are typically leaf-like grains approximately 1 mm to 7 mm in length in two dimensions and 250 µm to 400 µm in thickness and width. Shards having a maximum dimension of approximately 1 mm are sufficiently small that they do not need to be comminuted. Using shards, however, requires that concrete layer 20 be planarized after curing. Such planarizing, although an additional process step, allows the production of thinner photovoltaic cells 10 and 50, provides a better surface on which to adhere translucent conductive layer 30, and provides improved electrical contact to semiconductor particles 12.

Other photovoltaic materials, such as silicon carbide and gallium phosphide, can be used in semiconductor particles 12. The starting material for creating semiconductor particles 12 can be varied depending on the price and availability of the various raw materials.

In one embodiment, p-type portions 22 of semiconductor particles 12 are formed simultaneously with the formation of electrical connections between semiconductor particles 12 and conductive layer 28. Conductive layer 28 typically comprises an aluminum foil. The aluminum foil and the silicon of semiconductor particles 12 are briefly melted together at their interface by using, for example, a rapid thermal annealer or by applying a high voltage between the aluminum sheet and a tin-coated calendering roller on the opposite side of the matrix layer 14. The eutectic reaction at 578° C. results in a concentration of approximately $3 \times 10^{18}$ aluminum atoms per $cm^3$ in the resolidified silicon. Because aluminum is an electron acceptor, the aluminum-doped silicon is a p-type semiconductor. The interface between aluminum-doped p-type region 22 and the remaining n-type region 24 of semiconductor particles 12 results in a pn junction 26 that provides an internal electric field that drives the photo-induced charge carriers to conductive layers 28 and 30.

The depth of pn junction 26 is controlled by controlling the energy applied to melt the silicon-aluminum interface. Alternatively, the depth of the pn junction 26 can be controlled by limiting the quantity of aluminum available, for example, by vacuum depositing a thin layer of aluminum onto matrix layer 14 before melting the aluminum-silicon interface. After the pn junction is formed from the thin aluminum layer, an additional conductor, such as an aluminum foil, is applied onto major surface 16 to increase the cross-sectional area and reduce the sheet resistance of conductive layer 28. The aluminum foil can be bonded to the deposited aluminum by heating both layers above the 578° C. aluminum-silicon eutectic temperature. A preferred conductive layer 28 has a thickness of approximately 100 µm to 150 µm. P-type region 22 extends into semiconductor particle 12 a distance 44, preferably equal to the lesser of approximately 10 µm or half of-the diameter of semiconductor particles 12.

Another method of controlling the depth of pn junction 26 entails depositing a layer of aluminum approximately 2 µm in thickness onto a conductive substrate, such as a steel backing sheet, that has a melting temperature significantly higher than the 578° C. aluminum-silicon eutectic temperature. Upon heating to 578° C., the aluminum at the silicon interface melts to form the pn junctions and electrical contacts. The steel remains solid, essentially soldered to the silicon by the aluminum. Because of the detrimental atoms, such heavy metal atoms, such as iron, on minority carrier lifetimes in silicon, temperatures during formation of the pn junctions should remain low to preclude significant diffusion of atoms from the metallic backing sheet into the silicon.

If semiconductor particles 12 are not mixed into the matrix material before calendering, they can be deposited directly onto conductive layer 28. The matrix material can then be deposited onto the semiconductor particles 12 and conductive layer 28 to form concrete layer 20. For example, silicon particles can be distributed on an aluminum foil and then an MDFC can be calendered onto the aluminum foil using a conductive, e.g., tin-coated, roller having a sufficiently high voltage applied between the roller and the aluminum foil to weld the semiconductor particles 12 to the aluminum foil. During the welding, the p-type region would be formed by the eutectic process and the electrical contact between the aluminum and the silicon would be established. Any tin deposited by the roller onto the MDFC or the silicon would simply become a part of a conductive layer 30, which preferably comprises ITO.

Alternatively, semiconductor particles 12 can be deposited onto conductive layer 28 and pn junctions 26 could be formed, for example, by rapid thermal annealing. The matrix material is then deposited onto conductive layer 28, for example, by calendering with hard rubber rollers and cured to form matrix layer 14. Whether matrix layer 14 is deposited before or after pn junctions 26 are formed depends in part upon the ability of the matrix material to withstand without damage the short period at 578° C. required to form pn junctions 26.

To reduce deterioration of the matrix material during junction formation, the temperature required for junction formation can be reduced by adding one or more additional elements at the semiconductor particle-conductive layer interface. For example, an additional alloying material, such as tin, gallium, indium, or zinc, can be added to aluminum at the interface between conductive layer 28 and semiconductor particles 12. Such three-component systems can have a melting temperature lower than the silicon-aluminum binary system. The alloying material can be added, for example, by evaporating it onto major surface 16 or by depositing it onto or incorporating it into a metallic foil used to form conductive layer 28.

An alloying material is chosen not only for its ability to lower the junction formation temperature, but also for its corrosive influence on silicon dioxide, its ability to increase the reaction kinetics between aluminum and silicon, and its effects as a dopant. Binary systems other than the silicon-aluminum system could also be used to form the junctions. For example, antimony can be used to form pn junctions in p-type silicon particles.

If matrix layer 14 is formed from a cementitious material other than an MDFC, it will typically have pores that can fill with a conductive material during processing and cause short circuits between conductive layers 28 and 30. Such short circuits can be prevented by filling the pores using an electrodeposition process and then oxidizing or anodizing the exposed top surface of the deposited material to form an insulating layer. Short circuits through voids in concrete layer 20 caused by imperfect deposition of the matrix material can be similarly prevented. Shorted semiconductor particles 12, i.e., those in which both p-type region 22 and n-type region 24 contact the same conductive layer 28 or 30, can be isolated by an anodization process, similar to that described in U.S. Pat. No. 5,192,400 to Parker et al. for "Method of Isolating Shorted Silicon Spheres." The resistivity between conductive layers 28 and 30 across concrete layer 20 is preferably greater than 250 ohm/cm$^2$ to ensure a sufficiently small leakage current.

After pn junctions 26 are formed, translucent conductive layer 30 is formed by a process performed at a temperature below the decomposition temperature of the rheological agents used in the MDFC. For example, translucent conductive layer 30 can be formed by depositing a layer of ITO, preferably approximately 5 µm in thickness, onto major surface 18. Ion etching major surface 18 prior to depositing the ITO can improve adherence of the ITO layer, which is particularly useful at boundaries between the silicon and the cement and at silicon train boundaries, where the ITO may otherwise not adhere well. Heating photovoltaic cell 10 prior to deposition of the ITO is also thought to improve its adherence. Variations in the thickness of the deposited ITO layer, particularly at the boundaries of semiconductor particles 12, increase the sheet resistance of conductive layer 30.

A translucent conductive layer can also be deposited by an atomic layer epitaxy process. Because atomic layer epitaxy can provide excellent conformal coatings on dirty or irregular surfaces, it is well suited for coating concrete layer 20 with protruding semiconductor particles 12. ZnO:Al and ZnO:Ga, which are useful for forming a translucent conductive layer 30, can be deposited by atomic layer epitaxy at a temperature of between 120° C. and 350° C. using dimethyl zinc, trimethyl aluminum, and water. Such films exhibit resistivities of $8 \times 10^{-4}$ ohm-cm and transparencies of 80 percent. A 1-micron-thick layer of ZnO:Al deposited by atomic layer epitaxy is preferred to adequately adhere to both the concrete and the semiconductor particles 12 of concrete layer 20, maintain a sufficiently uniform thickness near the boundaries of semiconductor particles 12 so as to not unduly reduce the sheet resistance of conductive layer 30, and be sufficiently hard that no additional layer is needed to protect it from its environment. ZnO:Ga is also found to form a good electrical contact with semiconductor particles 12 and with other conductors used at major surface 18 to reduce sheet resistance. ZnO can also be deposited by sputter deposition at room temperature.

Figure 9:
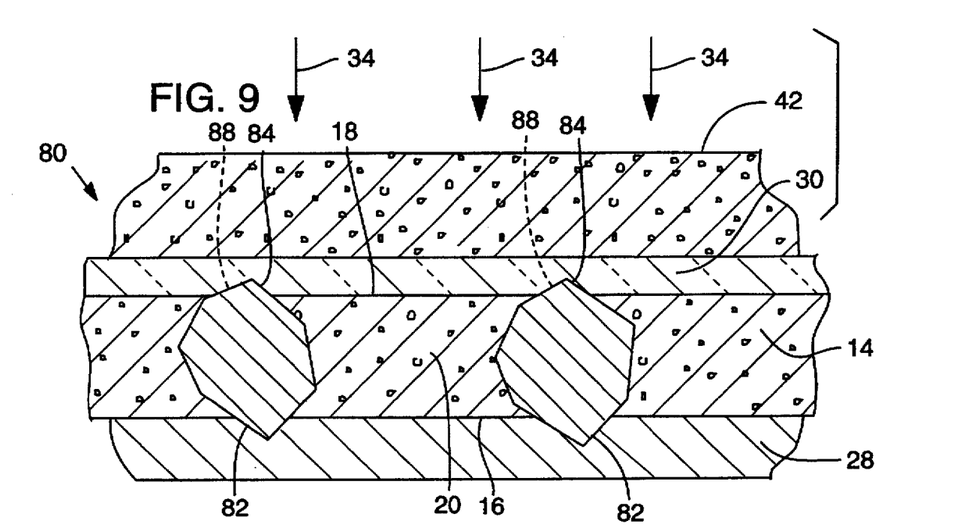
FIG. 9 is an enlarged, fragmentary view of a solar cell of the present invention similar to the solar cell of FIG. 1, but having semiconductor particles that use semiconductor-conductor surface junctions instead of internal pn junctions.

Besides the vertical internal pn junction 26 produced by the aluminum-silicon eutectic reaction described above, a built-in field can be produced in semiconductor particles 12 by other types of junctions, such as those formed at the interface between a semiconductor particle and an adjacent material. For example, FIG. 9 shows a photovoltaic cell 80 that uses a silicon-aluminum Schottky barrier junction 82 formed at the interface between semiconductor particle 84 and aluminum conductive layer 28. An additional surface barrier junction 88, which is identified by a phantom line to indicate that it is optionally used together with silicon-aluminum Schottky barrier junction 82, can also be formed at the interface of semiconductor particle 84 and an ITO or ZnO:Al translucent conductive layer 30.

ITO and ZnO:Ga or ZnO:Al are highly conductive, n-type wide band gap semiconductors. Their fermi levels are, relative to vacuum levels, somewhat higher than the conduction band edge of silicon. Thus, they have relatively small work functions. When used as the only non-ohmic junction to silicon in a solar cell, these materials produce a larger open circuit voltage when used with p-type silicon than when used with n-type silicon because there is more band bending with p-type and, therefore, a larger depletion region and depletion field. Solar cells can also be made using a Schottky barrier to any metal with a large work function on the back side and an ITO or ZnO surface barrier on the front side. There would then be two depletion regions, one at the top and one at the bottom. The band bending could be across the entire bandgap of the semiconductor material comprising the semiconductor particle.

Figure 10:
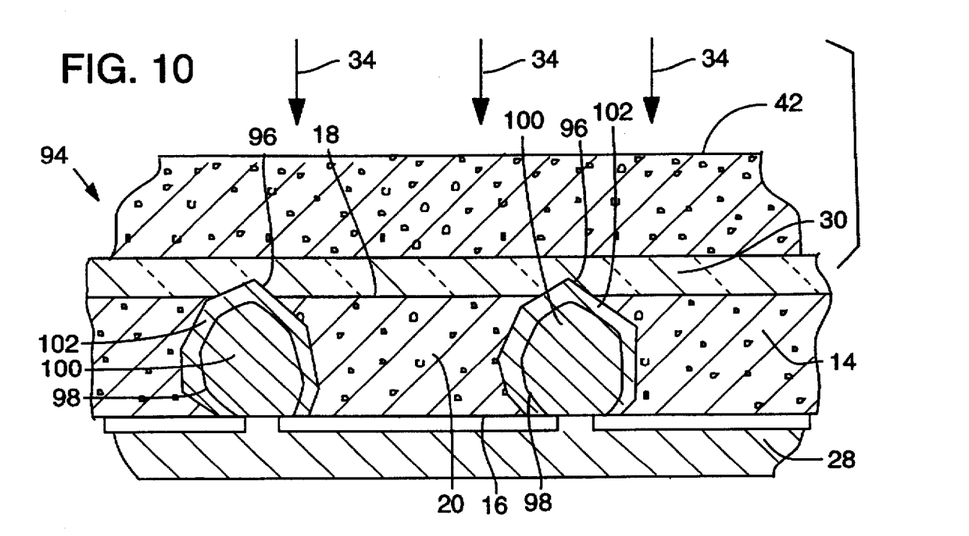
FIG. 10 is an enlarged, fragmentary view of a solar cell of the present invention similar to the solar cell of FIG. 1, but having semiconductor particles that include radial pn junctions.

Alternatively, junctions can be formed radially on semiconductor particles before they are cast into the cement. FIG. 10 shows a photovoltaic cell 94 using semiconductor particles 96 having radial junctions 98 formed at the interface of an interior region 100 and an exterior region 102 of semiconductor particles 96. In one embodiment, interior region 100 may comprise semiconductor silicon and exterior region 102 may comprise, for example, a conductive layer of metal, ITO, or ZnO:Al. Exterior region 102 can be formed, for example, by depositing a layer of a conductive material in a fluidized bed reactor. Junction 98 at the interface between the conductive material and the silicon provides the built-in field for photovoltaic cell 94.

In such an embodiment, it would be necessary to prevent the outer conductive layer from forming a short circuit to the bottom conductive layer. If doped ZnO is used, it can be removed from the surface of silicon grain extending through the bottom of matrix layer 14 by means of a concentrated solution of $NH_3$ in water. Alternatively, a coated doped ZnO or ITO layer can be removed by grinding. Thereafter, the anodic oxidation process described by Levine et al. (above) can be used to isolate the outer conductive layer from the back surface.

Alternatively, exterior region 102 can comprise a semiconductor material of a different type than interior region 100, thereby forming junction 98 as a pn junction at the interface. Exterior region 102 can be deposited, for example, using a fluidized bed chemical vapor deposition reactor. A preferred reaction in the fluidized bed chemical vapor deposition reactor uses $SiHCl_3$ at a temperature of between 1,000° C. and 1,300° C. and $B_2H_6$ and $PH_3$, diluted to between 10 ppm and 1,000 ppm in hydrogen, as respective p-type and n-type dopant sources. Alternately, junctions 98 can also be formed as a radial pn junction by using a diffusion process in a fluidized bed reactor.

It will be understood that the type of junction 98 to be formed will be determined by the dopant type and concentration in silicon semiconductor particles 96. For example, if a Schottky barrier junction is to be formed using ITO or doped ZnO, silicon semiconductor particles 96 preferably comprise p-type silicon having a resistivity of between 100 and 0.01 ohm-cm. Semiconductor particles 96 having a higher resistivity provide a wider depletion zone but a lower depletion zone electric field. Semiconductor particles 96 having a resistivity of about 1 ohm-cm have been found to be efficient and are preferred.

If a radial pn junction is to be formed, p-type silicon semiconductor particles 96 will require deposition of an n-type layer or diffusion of an n-type dopant to form exterior region 102. In one preferred embodiment, semiconductor particles 96 comprise boron-doped p-type silicon and an exterior region 102 is formed by diffusion of n-type dopant, such as phosphorus.

If Schottky barriers are used at both the top and bottom of semiconductor particles 96, for example using doped ZnO at the top and aluminum, platinum, or tungsten at the bottom, either n-type or p-type silicon could be used, but the semiconductor particles should be of a suitable size, preferably less than about 100 μm thick. Both interior region 100 and exterior region 102 must be electrically contacted to conduct the photo-induced electric current away from semiconductor particle 96 to conductive layers 30 and 28. If a radial junction 98 is used, the exterior region 102 must be penetrated to electrically contact interior region 100. Moreover, the interior region 100 and exterior region 102 must remain electrically isolated.

After casting the coated semiconductor particles 12 into the cement, the isolation and contact can be accomplished, for example, by mechanically or chemically removing a portion of exterior region 102 that protrudes from concrete layer 20. A thin insulating layer 108 is deposited over concrete layer 20, and then an opening 110 is etched in insulating layer 108 to allow electrically conductive layer 28 to contact interior portion 100. Such a procedure is known in the art and described, for example, in U.S. Pat. No. 4,614,835 to Carson et al. for "Photovoltaic Solar Arrays Using Silicon Microspheres."

The resistance between semiconductor particles 12 and an electrical load (not shown) is reduced in photovoltaic cell 50 by attaching conductive reinforcing fibers 52 to matrix layer 64 at major surface 68 to collect generated current, thereby reducing the sheet resistivity of major surface 68. Reinforcing fibers 52 are typically attached by pressing them into the cement prior to curing and prior to depositing translucent conductive layer 30. A preferred reinforcing fiber 52 comprises graphite fibers made from polyacrylonitrile or coal tar pitch. Such graphite fibers are available in diameters ranging from 7 μm to 14 μm and in lengths of up to several meters and can be purchased in a cloth form that can cover surface 68. Such graphite fibers typically have an electrical conductivity greater than that of copper and a strength-to-weight ratio much greater than that of steel and are known to be chemically inert in concrete.

Graphite fibers can be coated with a metal, such as zinc or nickel, to reduce the contact resistance between the graphite fibers and translucent conductive layer 30. Carbon whiskers having diameters of 100 mm are also usable, but are more costly. Conductive layer 30, which typically has a higher resistance than graphite fibers 52, conducts currents generated by semiconductor particles 12 to conductive reinforcing fibers 52, which then conduct the current to the electrodes of photovoltaic cell 10 or to metallic or to digitated electrode 32. Conductive reinforcing fibers 52 also prevent the formation of cracks in conductive layer 30. Such cracks can significantly decrease the efficiency of photovoltaic cell 10 by increasing the sheet resistivity of conductive layer 30.

Photovoltaic cell 10 optionally uses a metallic digitated electrode 32 deposited on translucent conductive layer 30 by known techniques to reduce the electrical resistance between semiconductor particles 12 and an electrical load (not shown) driven by photovoltaic cell 10 by effectively reducing the sheet resistance of translucent conductive layer 30. The area covered by digitated electrode 32 is sufficiently small that the increase in efficiency caused by the decreased electrical resistivity is greater than the decrease in efficiency caused by blocking some of the incident light 34. Metallic digitated electrode 32 is particularly useful on a large photovoltaic cell that covers a relatively large area. A larger photovoltaic cell generates more current than a smaller photovoltaic cell, and the current has a longer distance to travel in translucent conductive layer 30 before leaving the photovoltaic cell.

A photovoltaic cell 10 composed of an MDFC has sufficient structural strength and is sufficiently robust that it can be used on the sides or roofs of buildings without a protective structure and cover glass. However, an optional translucent protective layer 42, such as a thin MDFC sheet or a layer of nonconductive ZnO, can be applied as a protective, antireflective coating over metallic digitated electrode 32 and translucent conductive layer 30 to provide them with further environmental protection. Reinforcing fibers could also be used in protective layer 42 in addition to or in place of those in contact with cement layer 64.

Figure 11:
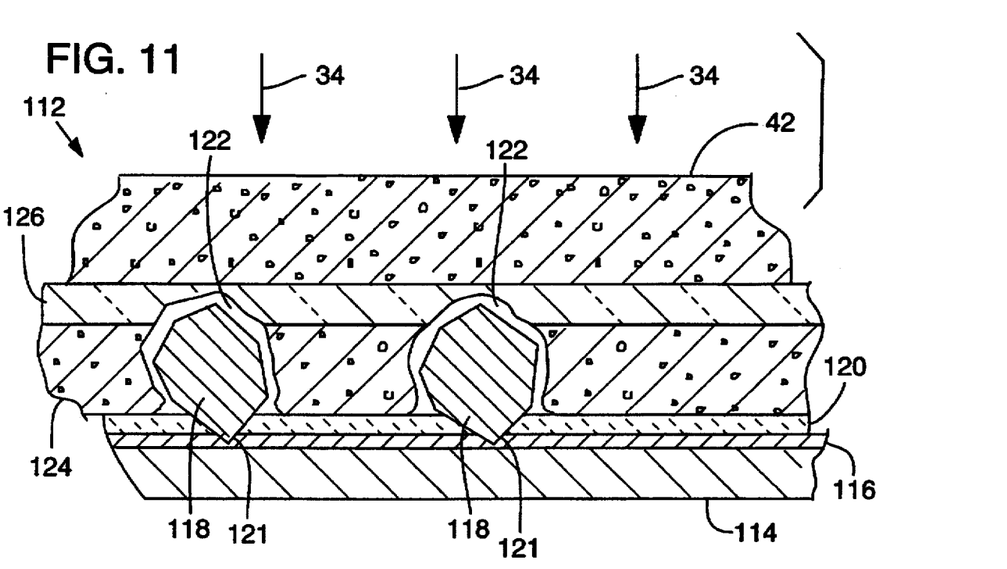
FIG. 11 is an enlarged, fragmentary view of a solar cell of the present invention similar to the solar cell of FIG. 1, but using an isolation layer and two Schottky barrier junctions.

FIG. 11 shows another embodiment of the invention, in which a photovoltaic cell 112 comprises a metal layer 114, preferably an aluminum layer about 200 μm thick, that provides electrical current-carrying capacity and mechanical strength. A thin metal layer 116, such as a nickel layer, is deposited, for example, by electroplating, onto metal layer 114.

Next, a electrical isolation layer 120, preferably comprising a dense ceramic, such as a alumina, magnesia, zirconia, or silica, is applied by a known process, such as tape laying or another of the thin ceramic casting methods that are used for forming substrates for electrical circuits. Isolation layer 120 is typically between 1 μm and 10 μm in thickness. Silicon particles 118 are then deposited onto the surface of isolation layer 120 and pressed by rolling or calendaring through isolation layer 120 and into contact with the nickel of thin layer 116.

The ceramic of isolation layer 120 is then vitrified at a suitable temperature. During vitrification, the metal in thin layer 116 forms a silicide 121 where it contacts silicon particles 118. The silicide consumes damaged silicon and forms electrical and mechanical contacts between metal layer 114 and silicon particles 118. The silicon particles 118 are then coated with a conductive layer 122, such as a 0.2 μm layer of doped ZnO to form a Schottky barrier around a large part of their perimeters. While coating silicon particles 118, ZnO may also be incidentally deposited onto isolation layer 120. A cement layer 124, typically 100 μm in thickness, is then deposited onto silicon particles 118 and isolation layer 120. A translucent conductive layer 126 of doped ZnO is then deposited to conduct current along the top surface.

Photovoltaic cell 112 uses two Schottky barriers, one formed at the interface of silicon particles 118 and the silicide 121 formed at thin layer 116, and one formed at the interface between silicon particles 118 and the doped ZnO layer surrounding it. During the manufacturing photocell 112, cement layer 124 is not exposed to high temperatures and low humidity that can degrade its integrity. Photovoltaic cell 112 can also be manufactured with other features, such as reinforcing fibers and a digitated electrode, described above with reference to other embodiments.

Although photovoltaic cell 10 could be produced as wide strips with arbitrary lengths, such a configuration would result in a low-voltage, large-current device. It would be preferable to configure multiple panels of photovoltaic cell 10 in a series to increase the voltage output. One method of series connecting photovoltaic cell 10 would be to assemble them as roofing shingles, with conductive layer 28 of each course electrically connected to the conductive layer 30 of the subsequent course, so that the voltage difference between each course and the first course increases with each subsequent course.

Photovoltaic cell 10 has sufficient structural strength and is sufficiently robust that it can be used on the outside of structures, such as concrete buildings, concrete railroad ties, and roofs, with no cover glass or other support structures. The rigidity of a typical photovoltaic cell 10 enhances its usefulness as a building material when compared to prior art, such as aluminum foil-matrix cells. Photovoltaic cell 10 is, therefore, inexpensive to install and requires little or no maintenance. Care must be taken, however, when photovoltaic cell 10 is installed on structures of conventional concrete that the water content of the conventional concrete does not corrode the aluminum of photovoltaic cell 10. This can be accomplished by placing a layer of MDFC between the aluminum and the conventional concrete.

It will be obvious that many changes may be made to the above-described details of the invention without departing from the underlying principles thereof. For example, pn junction 26 can be formed by methods other than those described. A photovoltaic cell can also be constructed using other junction types, such as a heterojunction or a metal-insulator-semiconductor junction, in place of the described junction. An electrochemical or galvanic cell can also be constructed using the principles of the present invention. In such a cell, concrete layer 20 is immersed in a fluid that electrochemically stores energy from incident light 34. The scope of the present invention should, therefore, be determined only by the following claims.

We claim:

1. A concrete solar cell, comprising:
   a cementitious layer having first and second major surfaces;
   a photovoltaic material embedded in the cementitious layer and extending beyond the first and second major surfaces;
   plural fibers in contact with and reinforcing the cementitious layer;
   a first electrically conductive material juxtaposed to the first major surface and electrically contacting the photovoltaic material; and
   a second electrically conductive material that transmits a portion of incident light, the second electrically conductive material being juxtaposed to the second major surface and electrically contacting the photovoltaic material.

2. The concrete solar cell of claim 1 in which the reinforcing fibers comprises electrically nonconductive reinforcing fibers.

3. The concrete solar cell of claim 2 in which the reinforcing fibers comprise aramid fibers.

4. The concrete solar cell of claim 2 in which the reinforcing fibers are randomly distributed within the cementitious layer.

5. The concrete solar cell of claim 4 in which the reinforcing fibers have diameters of between about 10 μm and about 30 μm.

6. The concrete solar cell of claim 4 in which the reinforcing fibers have lengths of between about 5 mm and 10 cm.

7. The concrete solar cell of claim 1 in which the reinforcing fibers extend primarily within a plane.

8. The concrete solar cell of claim 1 in which the reinforcing fibers comprise electrically conductive reinforcing fibers.

9. The concrete solar cell of claim 8 in which the reinforcing fibers are positioned at a major surface of the cementitious layer, the conductive reinforcing fibers conducting current generated by the photovoltaic material.

10. The concrete solar cell of claim 9 in which the electrically conductive reinforcing fibers are positioned at the second major surface and in which electrically nonconductive fibers are distributed within the cementitious layer.

11. The concrete solar cell of claim 8 in which the reinforcing fibers comprise a graphitic material.

12. The concrete solar cell of claim 11 in which the reinforcing fibers comprise a metal-coated graphitic material.

13. The concrete solar cell of claim 8 in which the reinforcing fibers comprise a metallic material.

14. The concrete solar cell of claim 8 in which the reinforcing fibers have diameters of between 7 μm and 14 μm.

15. The concrete solar cell of claim 1 in which electrically conductive reinforcing fibers are positioned at a major surface of the cementitious layer, the reinforcing fibers inhibiting the formation of cracks in the major surface.

16. The concrete solar cell of claim 15 in which the reinforcing fibers are positioned at both major surfaces of the cementitious layer.

17. The concrete solar cell of claim 1 in which the cementitious layer comprises a macrodefect-free cement material and the photovoltaic material includes silicon.

18. A method of manufacturing a concrete solar cell, comprising:

providing particles of a photovoltaic material;

embedding the particles of photovoltaic material in a cementitious layer so that the particles extend beyond major surfaces of the cement layer;

positioning reinforcing fibers in contact with the cementitious layer; and providing electrical contacts to the photovoltaic material to conduct current produced by the photovoltaic material.

19. The method of claim 18 in which embedding the particles in a cementitious layer includes embedding silicon particles in a layer of macrodefect-free cement.

20. The method of claim 18 in which positioning reinforcing fibers includes embedding nonconductive fibers in the cementitious layer.

21. The method of claim 20 in which embedding nonconductive fibers in the cementitious layer includes embedding aramid fibers.

22. The method of claim 20 in which embedding nonconductive fibers in the cementitious layer includes randomly distributing the fibers throughout the cementitious layer.

23. The method of claim 20 in which embedding nonconductive fibers in the cementitious layer includes embedding fibers having diameters of between about 10 μm and 30 μm.

24. The method of claim 18 in which positioning reinforcing fibers includes positioning multiple reinforcing fibers that extend transversely in a plane.

25. The method of claim 18 further comprising attaching conductive fibers at the surface of the cementitious layer, the conductive fibers carrying current produced by the photovoltaic material.

26. The method of claim 18 in which positioning reinforcing fibers includes attaching conductive fibers at the surface of the cementitious layer, the conductive fibers carrying current produced by the photovoltaic material.

27. The method of claim 26 in which positioning reinforcing fibers includes attaching graphitic conductive fibers at the surface of the cementitious layer.

28. The method of claim 26 in which positioning reinforcing fibers includes attaching conductive fibers having diameters of between 7 μm and 14 μm at the surface of the cementitious layer.

* * * * *